United States Patent [19]
Narayanan et al.

[11] Patent Number: 6,081,913
[45] Date of Patent: Jun. 27, 2000

[54] METHOD FOR ENSURING MUTUAL EXCLUSIVITY OF SELECTED SIGNALS DURING APPLICATION OF TEST PATTERNS

[75] Inventors: Sridhar Narayanan, Cupertino; Marc E. Levitt, Sunnyvale, both of Calif.

[73] Assignee: Sun Microsystems, Inc., Palo Alto, Calif.

[21] Appl. No.: 08/868,161

[22] Filed: Jun. 3, 1997

[51] Int. Cl.$^7$ ............................................. G01R 31/28
[52] U.S. Cl. ........................ 714/724; 714/727; 714/731; 714/744
[58] Field of Search ................................ 714/738, 724, 714/726, 727, 728, 729, 731, 744; 324/158.1, 73.1

[56] References Cited

U.S. PATENT DOCUMENTS

5,056,094  10/1991  Whetsel ................................. 714/736

*Primary Examiner*—Hoa T. Nguyen
*Attorney, Agent, or Firm*—Gunnison, McKay & Hodgson, LLP; Forrest Gunnison

[57] ABSTRACT

A method for controlling a gating circuit of an electronic system incorporating a scan architecture complying with IEEE Standard 1149.1 such that the gating circuit applies mutually exclusive signals to, for example, a decoded multiplexer. The gating circuit receives input signals from flip-flops that are part of a scan chain, is selectively controllable by a control signal to transmit predetermined mutually exclusive signals to the select inputs of the multiplexer during a scan mode. Alternatively, the gating circuit is controllable by the control signal to pass the input signals to the multiplexer in a normal operation or test mode. A mutual exclusivity circuit is provided to generate the control signal. During the scan mode, the control signal is generated at a first logic level such that the gating circuit transmits the predetermined mutually exclusive signals to the multiplexer while test values are being scanned into the flip-flops. Upon transition from the scan mode to the normal operation mode, the control signal is changed to a second logic level for a predetermined time period, and then changed back to the first logic level. When the control signal is at the second logic level, the gating circuit passes the input signals to the multiplexer, and the electronic system operates to propagate response signals that are applied to, for example, the scan chain flip-flops. In some instances, these response signals received by the flip-flops are not mutually exclusive, and the multiplexer may be damaged. The predetermined time period is set to apply the predetermined mutually exclusive signals before this possible damage occurs.

10 Claims, 4 Drawing Sheets

METHOD FOR ENSURING MUTUAL EXCLUSIVITY OF SELECTED SIGNALS DURING APPLICATION OF TEST PATTERNS

FIELD OF THE INVENTION

The present invention is related to test circuitry and, more particularly, to scan design test circuitry and test pattern generation.

BACKGROUND

Many high-speed applications such as, for example, microprocessors, use circuit devices that require mutually exclusive signals. For example, decoded multiplexers are commonly used in high-speed microprocessors and, as is well known in the art of microprocessor design, require mutually exclusive select signals. In normal functional operation, only one of the mutually exclusive signals in such a circuit is asserted at any given time, with the rest of the mutually exclusive signals being deasserted. By enabling only one mutually exclusive signal at a time, the circuit device avoids high current conditions in the circuit device. These high current conditions can damage or "burnout" the circuit device as well as result in the circuit device outputting an undefined signal.

Figure 1:
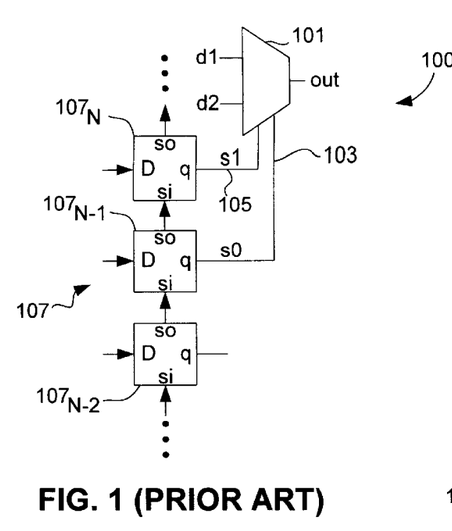
FIG. 1 is a block diagram of a portion of a conventional scan architecture circuit with a circuit device requiring mutually exclusive signals.

FIG. 1 is a block diagram illustrating a small part of a circuit 100 including a conventional decoded multiplexer 101 that is adapted for scan design testing. In particular, the multiplexer 101 has a first select lead 103 connected to receive a select signal s0. The multiplexer 101 also includes a second select lead 105 connected to receive a select signal s1. Because the multiplexer 101 is decoded, the select signals s0 and s1 must be mutually exclusive to prevent damage to the multiplexer 101. In this example, the select signals s0 and s1 are provided through scan flip-flops $107_N$ and $107_{N-1}$, that form part of a conventional scan chain 107. In a scan mode, the scan chain 107 can be serially loaded with test patterns to test the circuit 100 using well known scan design techniques. The test patterns are typically generated using an automatic test pattern generation (ATPG) software tool, which are well known in the art of test circuits. In particular, each of the flip-flops forming the scan chain 107 have a scan-in (si) lead connected to a scan-out (so) lead of the preceding flip-flop in the scan chain 107. In effect, the scan chain 107 resembles a large shift register. It will be appreciated that scan enable (se), clock and data lines interconnect the flip-flops 107 with other logic circuitry (not shown) of the circuit 100, which are omitted for clarity.

The circuit 100 is tested using scan design techniques well known in the art of test circuits. In a typical scan design scheme, a circuit is tested by: (a) configuring the circuit into a scan mode and "scanning in" a test pattern into the circuit's scan chain; (b) configuring the circuit into a normal functional mode and allowing the test pattern to propagate through the logic circuitry of the circuit; (c) pulsing the circuit and capturing the response in the scan chain; (d) configuring the circuit into the scan mode and "scanning out" the captured data from the scan chain for comparison with the expected values.

During the scan mode as the test pattern is scanned in or applied to the circuit 100, the test pattern may cause the flip-flops $107_N$ and $107_{N-1}$ to have values that violate the mutual exclusivity requirements of the multiplexer 101 regarding the select signals s0 and s1. The multiplexer 101 may be damaged as described above due to a high current condition caused by this violation of the mutual exclusivity requirement. One conventional solution is to constrain the ATPG software tool used to generate the test patterns to avoid patterns that violate the mutual exclusivity requirement of the multiplexer 101 (and, of course, every other circuit device in the circuit 100 that has a mutual exclusivity requirement). As a result, the complexity, computation time, and cost of the test pattern generation are typically relatively high. In addition, the constraints may result in poor fault coverage of the circuit 100.

Moreover, the response of the circuit 100 to the test patterns captured by the scan chain 107 may also violate the mutual exclusivity requirement of the multiplexer 101 either directly or as the capture data is scanned out of the scan chain 107. Consequently, the ATPG software tool must be further constrained to generate test patterns that cause the circuit 100 to respond with capture data that complies with the mutual exclusivity requirements of the multiplexer 101. Of course, the ATPG software tool is similarly constrained to avoid violating the mutual exclusivity requirements (if any) of every other circuit device in the circuit 100. These two constraints cause a significant increase in the complexity, computation time and cost of test pattern generation, and typically reduce the fault coverage of the test patterns.

Figure 2:
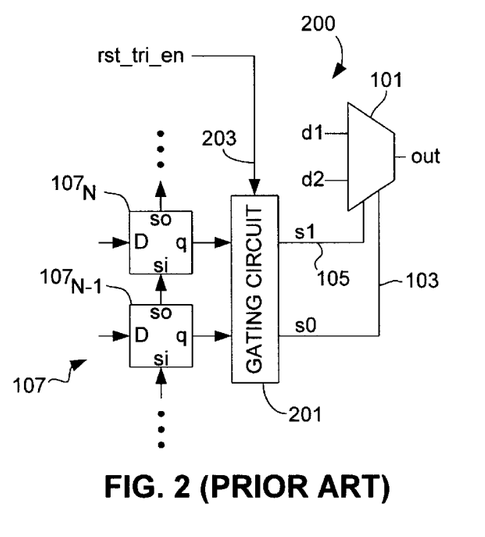
FIG. 2 is a block diagram of a portion of a conventional scan architecture circuit with a conventional gating circuit.

FIG. 2 shows a block diagram of a portion of a circuit 200 implementing a typical conventional solution to the above problem. The circuit 200 is substantially similar to the circuit 100 (FIG. 1) except that the circuit 200 includes a gating circuit 201 coupling the flip-flops $107_N$ and $107_{N-1}$ to the multiplexer 101. The circuit 200 has a similar gating circuit for each circuit device requiring mutually exclusive signals.

More specifically, in this conventional solution the select leads 103 and 105 of the multiplexer 101 are connected to the gating circuit 201 rather than directly to the flip-flops $107_N$ and $107_{N-1}$. The gating circuit 201 is also connected to receive a signal rst_tri_en via a line 203. The rst_tri_en signal is a "global" signal (i.e., a signal provided to the gating circuits of all of the circuit devices with mutual exclusivity requirements) typically provided by a conventional Reset block or test access port (TAP) controller. In particular, conventional TAP controllers are defined in "The IEEE Standard Test Access Port and Boundary Scan Architecture, IEEE Standard 1149.1-1990", which is incorporated herein by reference. Such TAP controllers and Reset blocks are well known in the art of test circuits.

The gating circuit 201 functions to gate the signals from the flip-flops $107_N$ and $107_{N-1}$ to the select leads 103 and 105 of the multiplexer 101 only during the normal operation mode. The gating circuit 201 operates to force the signals on the select leads 103 and 105 to predetermined mutually exclusive logic levels. Thus, while test patterns are being scanned into the scan chain 107, the gating circuit 201 prevents the test pattern from propagating to the multiplexer 101. Accordingly, the test pattern need not be constrained to comply with the mutual exclusivity requirements of the select signals s0 and s1 during the scan in phase. Although the test pattern, when finally scanned in, does have to meet the mutual exclusivity requirements of the select signals s0 and s1. In addition, as described below in conjunction with FIGS. 3 and 4, the gating circuit 201 does not address the response constraint.

Figure 3:
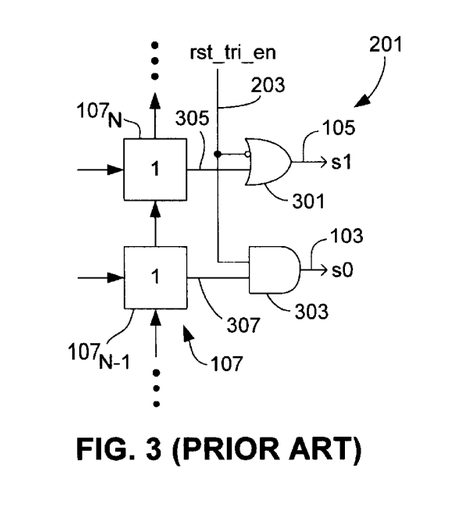

FIG. 3 is a circuit diagram of a conventional gating circuit 201. In this example, the gating circuit 201 includes a two-input OR-gate 301 and a two-input AND-gate 303. The OR-gate 301 has an inverting input lead connected to receive the rst_tri_en signal. The other input lead of the OR-gate 301 is connected to the output lead 305 of the flip-flop $107_N$. The AND-gate 303 has one input lead connected to receive the rst_tri_en signal while its other input lead is connected to the output lead 307 of the flip-flop $107_{N-1}$. The rst_tri_en signal is generated to have a logic high level during the normal functional mode and to have a logic low level during the scan mode.

When the rst_tri_en signal is at a logic low level, the inverting input lead of the OR-gate 301 forces the OR-gate 301 to output the select signal s1 at a logic high level onto the select lead 105. The logic low level of the rst_tri_en signal also forces the AND-gate 303 to output the select signal s0 at a logic low level onto the select lead 103. The gating circuit 201, by forcing the select signals s0 and s1 to respectively have logic low and logic high levels, ensures that the select signals are mutually exclusive during the scan mode.

Conversely, when the rst_tri_en signal is at a logic high level, the inverting input lead of the OR-gate 301 allows the OR-gate 301 to output onto the select lead 105 the signal s1 with a logic level equivalent to the stored logic level of the flip-flop $107_N$ received through the lead 305. The logic high level of the rst_tri_en signal also allows the AND-gate 303 to output onto the select lead 103 the signal s0 with a logic level equivalent to the stored logic level of the flip-flop $107_{N-1}$ received through the lead 307. Accordingly, the gating circuit 201, in effect, isolates the flip-flops $107_N$ and $107_{N-1}$ from the multiplexer 101 (FIG. 2) during the scan mode and propagates the stored signals in the flip-flops to the multiplexer 101 during the normal mode.

Figure 4:
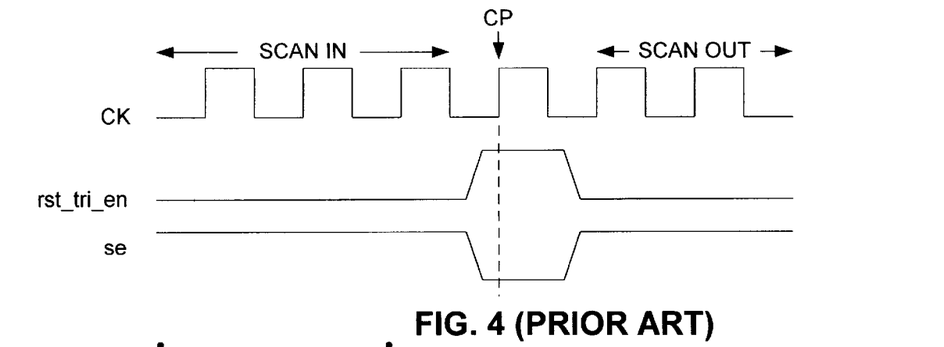
FIG. 4 is a timing diagram illustrative of the operation of the portion of the conventional scan architecture circuit depicted in FIG. 2.

In particular, the flip-flops in the scan chain 107 (FIG. 2) receive the clock signal CK illustrated in the timing diagram of FIG. 4. In the first portion of the timing diagram, the circuit 200 is configured to scan in the test pattern. More specifically, the circuit 200 is configured in the scan mode as indicated by the scan enable signal se being asserted (i.e., at a logic high level) and the rst_tri_en signal being deasserted (i.e., at a logic low level).

After the test pattern is scanned in, the circuit 200 is configured into the normal mode and the next clock cycle is used to load the response data into the scan chain 107. More specifically, just prior to the rising edge of the capture pulse CP, the scan enable signal se is deasserted and the rst_tri_en signal is asserted, configuring the scan chain 107 into the normal mode. In the normal mode, the circuit 200 operates on the test pattern stored in the scan chain, including the pattern stored in the flip-flops $107_N$ and $107_{N-1}$ and propagated to the logic circuitry through the gating circuit 201.

Figure 5:
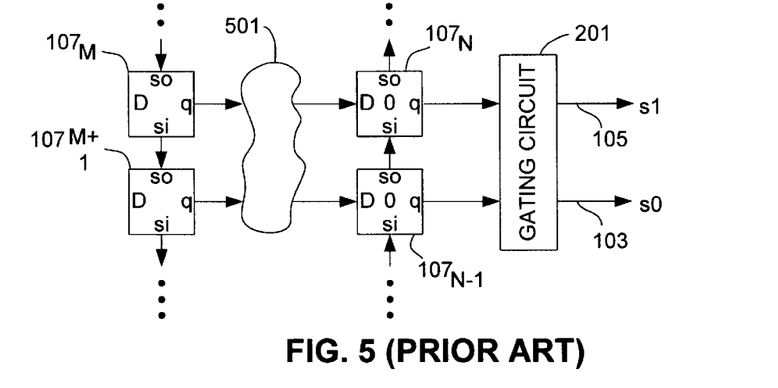
FIG. 5 is a block diagram of a portion of the conventional scan architecture circuit illustrative of non-mutually exclusive response data.

For example, as shown in FIG. 5, the test pattern loaded in the scan chain 107, can include flip-flops $107_M$ and $107_{M+1}$ that cause logic circuitry 501 to generate logic signals that are received by the flip-flops $107_N$ and $107_{N-1}$. Then the leading edge of the capture pulse CP (FIG. 4) causes the flip-flops $107_N$ and $107_{N-1}$ to store the logic levels of these received signals, that are then provided to the gating circuit 201. However, because the capture pulse CP is a "normal" mode operation, the gating circuit 201 will allow the response or capture data from the flip-flops $107_N$ and $107_{N-1}$ to propagate to the multiplexer 101 throughout the remaining duration of the capture pulse. Thus, if the response data captured in the flip-flops $107_N$ and $107_{N-1}$ have identical logic levels (e.g., the zeros indicated in FIG. 5), the gating circuit 201 propagates non-mutually exclusive select signals to the multiplexer 101, which can damage the multiplexer 101 as described above. Consequently, in this conventional scheme, the ATPG software tool must still be constrained to avoid generating test patterns causing the circuit 200 (FIG. 2) from generating response or capture data that provide non-mutually exclusive select signals to the multiplexer 101 (and any other circuit device in the circuit 200 that requires mutually exclusive signals). Accordingly, there is a need for a technique to avoid the "response data constraint" on the ATPG tool in generating test patterns.

SUMMARY

In accordance with the present invention, a method is provided for ensuring mutual exclusivity of selected signals in applying test patterns during scan testing. In one embodiment, the method includes receiving the conventional rst_tri_en signal and generating therefrom a local_rst_tri_en signal. During the scan mode, the local_rst_tri_en signal is generated to be substantially identical to the rst_tri_en signal. In addition, when the rst_tri_en signal transitions to a logic high level in preparation for the capture pulse, the local_rst_tri_en signal is generated to be substantially identical. However, after the leading edge of the capture pulse, the local_rst_tri_en signal is generated to have a falling edge after a relatively short predetermined time period. This predetermined time period has a duration that allows the response data to be captured in the scan chain without damaging circuit devices coupled to the scan chain that have mutual exclusivity requirements.

In one particular embodiment, the method is implemented with an AND-gate, an inverter, and two scan flip-flops. The first flip-flop has a data input lead connected to receive a hardwired logic low level signal and has a scan input lead connected to receive a hardwired logic high level. The first flip-flop has an output lead connected to a data input lead of the second flip-flop. The scan-input lead of the second flip-flop is connected to receive a hardwired logic low level signal. The output signal generated by the second flip-flop is inverted by the inverter and provided to the AND-gate. The AND-gate is also connected to receive the rst_tri_en signal and output a local_rst_tri_en signal to a conventional gating circuit (e.g., gating circuit 201 in FIG. 2).

During the scan mode, the second flip-flop stores the logic low level received at its scan input lead, which is then inverted and received by the AND-gate. However, the AND-gate outputs the local_rst_tri_en signal at a logic low level because the rst_tri_en signal (described above) is at a logic low level during the scan mode. Thus, the gating circuit operates as in a conventional circuit, outputting mutually exclusive signals. It will be appreciated that during the scan mode, the first flip-flop outputs a logic high level to the data input lead of the second flip-flop.

Prior to the leading edge of the capture pulse, the rst_tri_en signal transitions to a logic high level, to enable the shifted test pattern to propagate through the circuit under test. This transition of the rst_tri_en signal also causes the local_rst_tri_en signal to transition to a logic high level. However, at the capture edge, after a short propagation delay through the second flip-flop, the inverter and the AND-gate, the logic high output signal of the second flip-flop causes the local_rst_tri_en signal to transition to a logic low level. The logic low level of the local_rst_tri_en signal causes the gating circuit to output mutually exclusive signals as described above in conjunction with FIGS. 3 and 4. This short propagation delay is predetermined to be sufficient in duration to allow the scan chain flip-flops to properly capture the response data, but short enough in duration to avoid damaging the circuit device receiving response signals from the scan chain if the signals are not mutually exclusive.

Accordingly, the ATPG software tool can be allowed to generate test patterns that result in non-mutually exclusive response data, thereby significantly reducing the complexity, processing time and costs of generating test patterns.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3 is a circuit diagram of the conventional gating circuit depicted in

DETAILED DESCRIPTION

Figure 6:
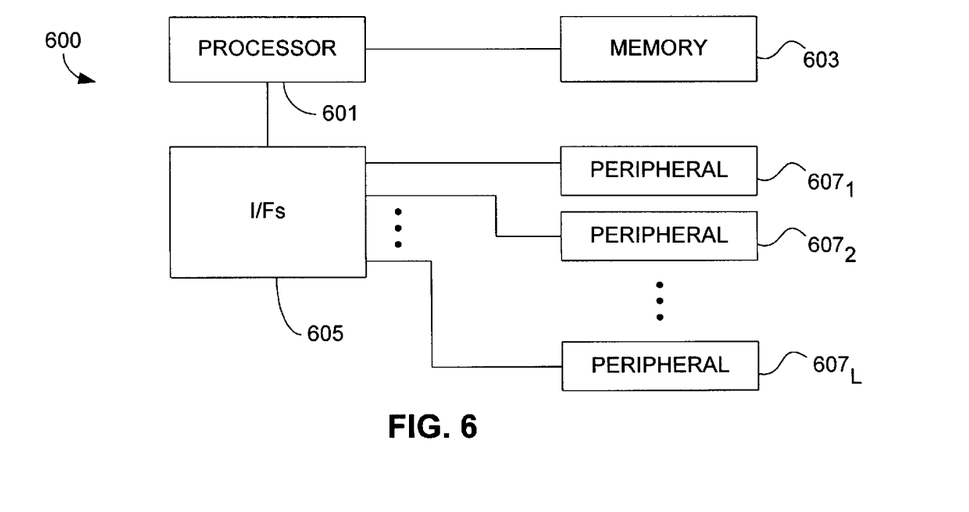
FIG. 6 is a block diagram of an electronic system having a mutual exclusivity circuit according to one embodiment of the present invention.

FIG. 6 is a block diagram of an electronic system 600 according to one embodiment of the present invention. The electronic system 600 includes an integrated circuit 601 with a mutual exclusivity circuit (embodiments of which are described below in conjunction with FIGS. 7–11), a memory 603, interfaces 605 and peripherals $607_1$–$607_L$.

The electronic system 600 can be any type of electronic system. In this embodiment, the electronic system 600 is a computer system in which the integrated circuit 601 is a processor connected to the memory 603 and to interfaces 605. The processor can be any type of processor such as, for example, Pentium®, X86, Sparc®, Alpha®, MIPS®, HP®, and PowerPC® processors. The interfaces 605 are connected to peripherals $607_1$–$607_L$, thereby allowing the processor 601 to interact with the peripherals $607_1$–$607_L$. The memory 603 and the interfaces 605 can be any suitable type of memory or interface for use in computer systems. Likewise, the peripherals can be of any suitable type of peripheral such as, for example, displays, mass storage devices, keyboards or any other type of input or input-output device. In accordance with the present invention, the mutual exclusivity circuit used in the integrated circuit 601 removes the "response data" constraint from the ATPG software tool when generating test patterns, thereby decreasing the complexity, processing time, and cost of generating test patterns.

Figure 7:
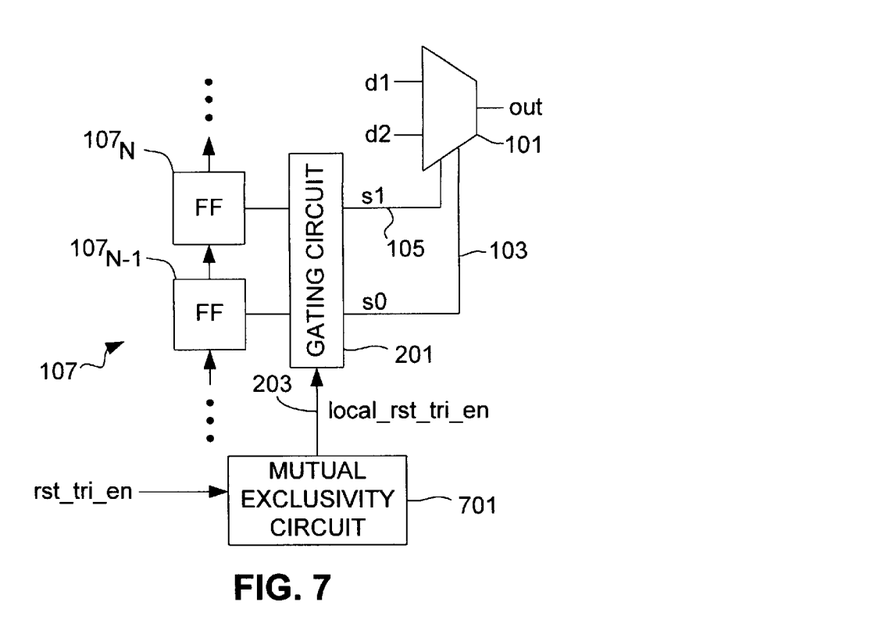
FIG. 7 is a block diagram of a portion of a scan architecture circuit having a mutual exclusivity circuit according to one embodiment of the present invention.

FIG. 7 is a block diagram of a portion of a scan architecture circuit 700 including a mutual exclusivity circuit 701 according to one embodiment of the present invention. The circuit 700 can be all or part of the integrated circuit 601 (FIG. 6). The circuit 700 is substantially similar to the circuit 200 (FIG. 2) except that the circuit 700 includes a mutual exclusivity circuit 701 connected to the gating circuit 201. It is understood by those skilled in the art of test circuits that the circuit 700 includes a substantially similar mutual exclusivity circuit for every circuit device having mutual exclusivity requirements (e.g., three-state bus buffers, decoded multiplexers). It will be understood by those skilled in the art of test circuits that the term "mutual exclusivity requirement" refers to the requirement of a circuit device that receives a set of two or more signals of which only one signal of the set can be asserted at any time. This requirement is sometimes referred to as a "one-hot requirement (or a "one-cold" requirement in circuit devices that require only one signal be at a logic low level).

Figure 8:
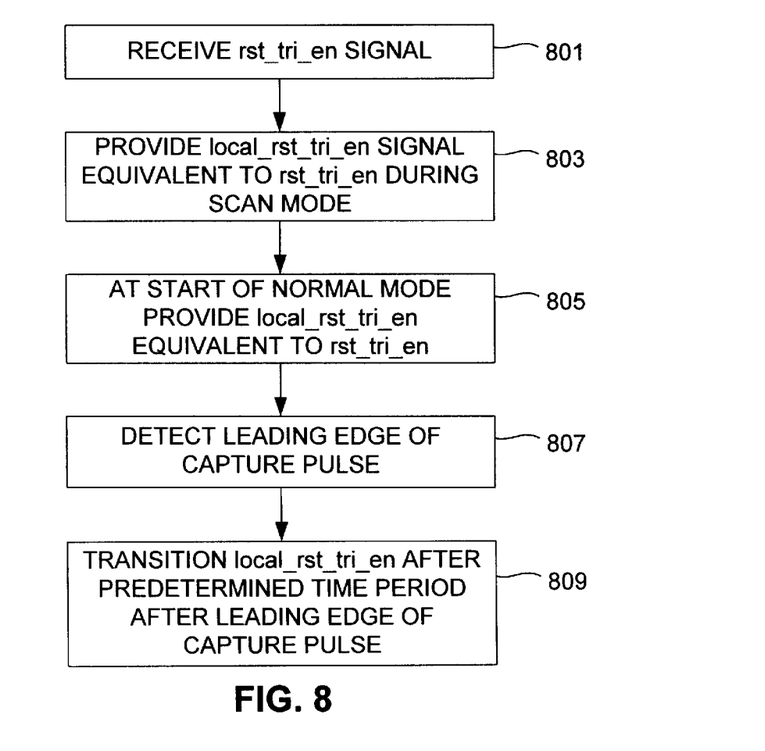
FIG. 8 is a flow diagram illustrative of the operation of the mutual exclusivity circuit depicted in FIG. 7.

FIG. 8 is a flow diagram illustrative of the operation of the mutual exclusivity circuit 701 (FIG. 7). The operation of the mutual exclusivity circuit 701 is described below with reference to FIGS. 7 and 8.

In a step 801, the mutual exclusivity circuit 701 receives the rst_tri_en signal. In a next step 803, the mutual exclusivity circuit 701 provides a local_rst_tri_en signal (via the line lead 203) instead of the rst_tri_en signal to the conventional gating circuit 201. During the scan mode, the local_rst_tri_en signal is substantially identical to the rst_tri_en signal. In transitioning to the normal mode, as shown in a next step 805, the local_rst_tri_en signal transitions to a logic high level at the leading edge of the capture pulse (see FIG. 4), as does the rst_tri_en signal.

However, in a next step 807, the local_rst_tri_en signal transitions to a logic high level for only a relatively short predetermined time period. The duration of this predetermined time period is sufficiently long so that the response data may be captured in the scan chain 107, unlike the rst_tri_en signal which remains at a logic high level for about the entire clock cycle of the capture pulse. In addition, the predetermined duration of the local_rst_tri_en "pulse" is short enough to avoid damage to the multiplexer 101 and any other circuit device requiring mutually exclusive signals that can be propagated from the scan chain 107 if these signals are not mutually exclusive. Accordingly, the ATPG software tool can be allowed to generate test patterns that result in non-mutually exclusive response data, thereby significantly reducing the complexity, processing time and costs of generating test patterns.

Figures 9, 10:
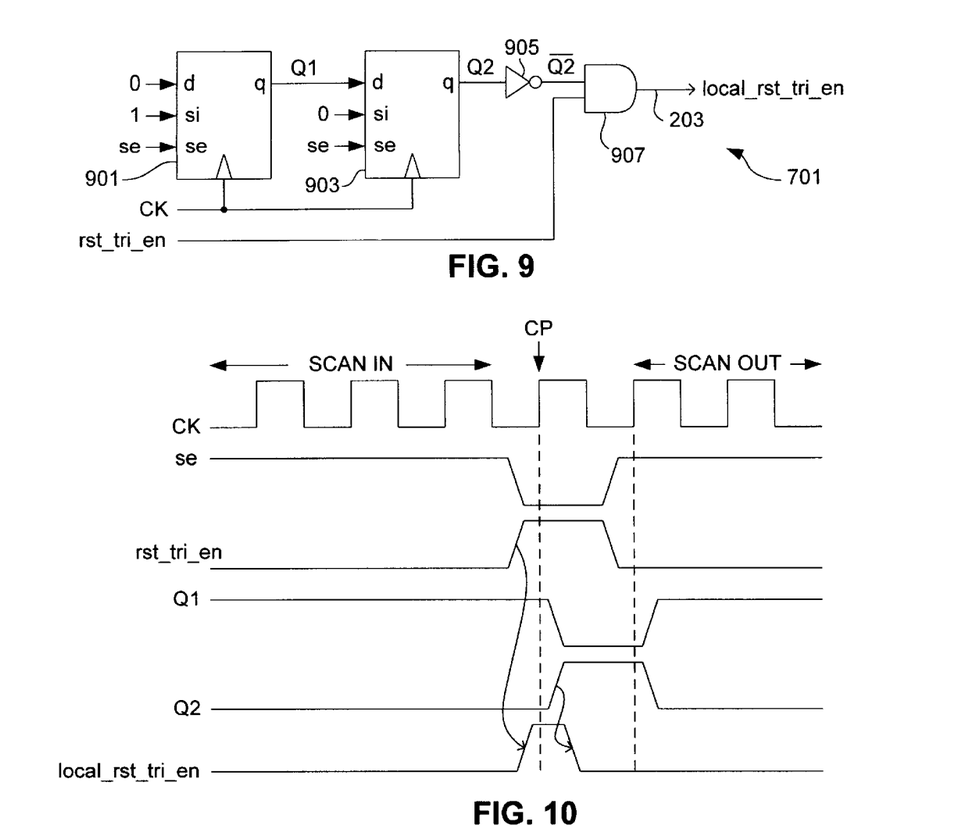
FIG. 9 is a circuit diagram of one embodiment of a mutual exclusivity circuit according to the present invention.
FIG. 10 is a timing diagram illustrative of the operation of the portion of the scan architecture circuit depicted in FIG. 9 using the mutual exclusivity circuit depicted in FIG. 9.

FIG. 9 is a circuit diagram of one embodiment of the mutual exclusivity circuit 701 (FIG. 7) according to the present invention. In this embodiment, the mutual exclusivity circuit 701 includes a first scan flip-flop 901, a second scan flip-flop 903, an inverter 905 and a two-input AND-gate 907. The first flip-flop 901 has a data input lead connected to receive a logic low level signal and has a scan-input lead connected to receive a logic high level signal. The second flip-flop 903 has a data input lead connected to the q (non-inverting) output lead of the first flip-flop 901 and has a scan-input lead connected to receive a logic low level signal. The scan flip-flops 901 and 903 are conventional scan flip-flops and, thus, are connected to receive a scan enable signal se and a clock signal CK. The inverter 905 is connected between the q output lead of the second flip-flop 903 and an input lead of the AND-gate 907. The other input lead of the AND-gate 907 is connected to receive the rst_tri_en signal. The output lead of the AND-gate 907 is coupled to the gating circuit 201 (FIG. 7) through the line 203. It will be appreciated that the flip-flops 901 and 903 are not part of the scan chain 107 (FIG. 7).

FIG. 10 is a timing diagram illustrative of the operation of the mutual exclusivity circuit 701 (FIG. 9). Referring to FIGS. 9 and 10, the mutual exclusivity circuit 701 operates as follows. To scan in the test pattern, the scan enable signal se is asserted and the rst_tri_en signal is deasserted, placing the circuit 700 (FIG. 7) in the scan mode. Thus, during the scan mode, the AND-gate 907 outputs the local_rst_tri_en signal at a logic low level because the rst_tri_en signal is at a logic low level. Thus, the gating circuit operates as in a conventional circuit, outputting mutually exclusive signals.

Also during the scan mode, the second flip-flop 903 stores the logic low level received at its scan-input lead. Thus, the second flip-flop 903 outputs a signal Q2 with a logic low level to the inverter 905, which provides the complement of the signal Q2 to the AND-gate 907. In this embodiment, the signal received at the scan-input lead of the second flip-flop 903 is provided by hardwiring the scan-input lead to a ground line. Similarly, the first flip-flop 901 stores and outputs the hardwired logic high level signal received at the scan-input lead of the first flip-flop 901. Consequently, during the scan mode, the first flip-flop 901 outputs a signal Q1 with logic low level to the data input lead of the second flip-flop 903.

Just prior to the leading edge of the capture pulse CP, the rst_tri_en signal transitions to a logic high level and the scan enable signal se transitions to a logic low level. Thus, the circuit 700 is configured in the normal mode. As a result of the logic high level of the rst_tri_en signal received by the AND-gate 907, the local_rst_tri_en signal also transitions to a logic high level, which causes the gating circuit 201 to output the data from the scan chain 107, as in a conventional circuit.

In addition, at the leading edge of the capture pulse CP, the logic low level of the scan enable signal se causes the first and second flip-flops 901 and 903 to store the logic levels of the signals received at their respective data input leads. Thus, at the leading edge of the capture pulse CP, the flip-flops 901 and 903 generate the signals Q1 and Q2 with logic low and logic high levels, respectively.

After a short propagation delay through the inverter 905, the logic high level of the signal Q2 of the second flip-flop is inverted, causing the local_rst_tri_en signal generated by the AND-gate 907 to transition to a logic low level, creating a relatively short duration local_rst_tri_en "pulse". The now logic low level of the local_rst_tri_en signal causes the gating circuit 201 to operate as if the circuit 700 (FIG. 7) is in the scan mode. More specifically, the logic low level of the local_rst_tri_en signal causes the gating circuit 201 to output mutually exclusive signals at the leads 103 and 105 as described above in conjunction with FIGS. 3 and 4. The short propagation delay from the second flip-flop 903, the inverter 905 and the AND-gate 907 is predetermined so that the duration of the loca_rst_tri_en "pulse" is sufficient to allow the flip-flops of the scan chain 107 to properly store the response data. In addition, the local_rst_tri_en "pulse" is predetermined to be short enough in duration to avoid damaging the multiplexer 101 (FIG. 7) receiving the response signals from the flip-flops $107_N$ and $107_{N-1}$ if these response signals are not mutually exclusive. In this embodiment, the predetermined time period is about 500 nanosecond, but can be in the range of 0.4–2 nanoseconds, depending on the delays, clock skews and hold time requirements of the scan chain flip-flops and other circuit-based parameters (in addition to the design and tolerance of the multiplexer 101 to mutual exclusivity violations as described above). Accordingly, the ATPG software tool can be allowed to generate test patterns that result in non-mutually exclusive response data, thereby significantly reducing the complexity, processing time and costs of generating test patterns. The mutual exclusivity circuit 701 provides control of the rst_tri_en signal locally at the circuit device requiring the mutually exclusive signals, thereby helping to ensure that the timing requirements are met for capturing the response data while avoiding damage to the circuit device.

Figure 11:
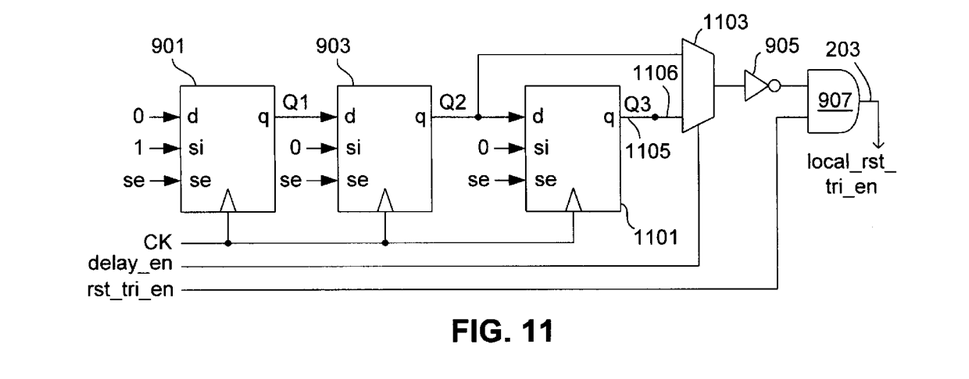
FIG. 11 is a circuit diagram of a second embodiment of a mutual exclusivity circuit for use in delay testing, according to the present invention.

FIG. 11 is a circuit diagram of an exclusivity circuit 1100 for use in delay testing, according to another embodiment of the present invention. As is well known in the art of test circuits, delay testing is a form of scan test in which the circuit under test is allowed to operate in the normal mode for two or more clock cycles after the test pattern is scanned in. This embodiment of the mutual exclusivity circuit 1100 is selectively configured into either a normal scan test or a two capture edge delay test.

The exclusivity circuit 1100 is substantially similar to the exclusivity circuit 701 (FIG. 9), except that the exclusivity circuit 1100 includes a third flip-flop 1101 and a two-input multiplexer 1103. In particular, the q output lead of the second flip-flop 903 is connected to the input lead 1104 of the multiplexer 1103. The q output lead of the second flip-flop 903 is also connected to the data input lead of the third flip-flop 1101. The q output lead 1105 of the third flip-flop 1101 is connected to the other input lead 1106 of the multiplexer 1103. The output lead of the multiplexer 1103 is connected to the input lead of the inverter 905. The multiplexer 1103 is connected to receive a delay_en signal from the conventional TAP controller or Reset controller (not shown). Such delay_en signals are well known in the art of test circuits. Otherwise, the mutual exclusivity circuit 1100 is interconnected as described above in conjunction with FIG. 9 for the mutual exclusivity circuit 701.

When the delay_en signal is deasserted (i.e., at a logic low level), the mutual exclusivity circuit 1100 is configured in the normal scan test mode. The logic low level of the delay_en signal causes the multiplexer 1103 to output to the inverter 905 the Q2 signal received from the second flip-flop 903. Thus, the mutual exclusivity circuit 1100 in effect bypasses the third flip-flop 1101 and operates as described above in conjunction with FIGS. 9 and 10.

In contrast, when the delay_en signal is asserted, the mutual exclusivity circuit 1100 is configured in the delay test mode. In the delay test mode, the rst_tri_en signal is asserted for two clock cycles (instead of one as in the normal scan mode) to allow the circuit under test to receive two consecutive capture edges for this embodiment of the delay testing scheme. Similarly, the scan enable signal se is deasserted for two clock cycles. The logic high level of the delay_en signal causes the multiplexer 1103 to output to the inverter 905 the output signal Q3 from the q output lead of the third flip-flop 1101. Thus, the logic high level (from the q output lead) of the first flip-flop 901 requires two clock edges to be propagated to the inverter 905. After a short propagation delay, the inverter 905 inverts this logic high level from the third flip-flop 1101 and thus provides a logic low level to the AND-gate 907. The AND-gate 907 then causes the local_rst_tri_en signal to transition to a logic low level. As described above in conjunction with FIG. 7, the gating circuit 201 then causes the select signals s0 and s1 to be mutually exclusive after a predetermined time period from the leading edge of the local_rst_tri_en "pulse" (i.e., the gating circuit causes the select signals to be mutually exclusive at the falling edge of the local_rst_tri_en signal). This predetermined time period is sufficient to capture the response data without damaging the circuit device requiring mutually exclusive signals. As in conventional circuits, the ATPG software tool must be constrained to generate test patterns for the first capture edge of delay tests that meet mutual exclusivity requirements. However, no such constraints are needed for the second capture edge. Thus, the complexity, processing time and costs for generating test patterns for delay tests can also be significantly reduced.

The embodiments of the method for ensuring mutual exclusivity of selected signals described above are illustrative of the principles of this invention and are not intended to limit the invention to the particular embodiments described. For example, other embodiments may be adapted for circuit devices having a mutual exclusivity (or one-hot) requirement for a set of three or more signals. In light of this disclosure, those skilled in the art of test circuit design can implement different embodiments of the mutual exclusivity circuit without undue experimentation. In addition, using this disclosure, those skilled in the art of test circuit design can implement without undue experimentation other embodiments adapted for scan testing schemes with separate scan clock signals. Accordingly, while a preferred embodiment of the invention has been illustrated and described, it will be appreciated that in view of this disclosure, various changes can be made therein without departing from the spirit and scope of the invention.

The embodiments of the invention in which an exclusive property or privilege is claimed are defined as follows:

1. A method for controlling a gating circuit of an electronic system to prevent damage to a circuit device having a mutual exclusivity requirement that is coupled to first and second output terminals of the gating circuit, the gating circuit having a first input terminal and a second input terminal and being selectively controllable to transmit predetermined mutually exclusive signals on the first and second output terminals in response to a control signal having a first logic level, and selectively controllable to pass first and second signals from the first and second input terminals to the first and second output terminals when the control signal has a second logic level, the method comprising:

maintaining the control signal at the first logic level during a first mode, thereby causing the gating circuit to prevent passage of the first and second signals from the first and second input terminals to the first and second output terminals;

altering the control signal to the second logic level at the beginning of a second mode following the first mode, thereby causing the gating circuit to pass first and second test signals from the first and second input terminals to the first and second output terminals; and after a predetermined time period following the beginning of the second mode, transitioning the control signal back to the first logic level, wherein the predetermined time period has a duration selected to prevent damage to the circuit device caused by first and second response signals applied to the first and second input terminals during operation of the electronic system in the second mode.

2. The method according to claim 1,
wherein the electronic system includes a mutual exclusivity circuit for generating the control signal in response to a rst_tri_en signal and a scan-enable signal that are transmitted in the electronic system, and
wherein the step of maintaining the control signal at the first logic level is performed while the rst_tri_en signal is maintained at a low logic level and the scan-enable signal is maintained at a high logic level.

3. The method according to claim 1,
wherein the electronic system includes a mutual exclusivity circuit for generating the control signal in response to a rst_tri_en signal, a scan-enable signal and a clock signal that are transmitted in the electronic system, and
wherein the step of altering the control signal to the second logic level is performed when the rst_tri_en signal transitions from a low logic level to a high logic level, and when the scan-enable signal transitions from a high logic level to a low logic level, and
wherein the step of transitioning the control signal from the second logic level to the first logic level includes detecting a leading edge of the clock signal following the transitions of the rst_tri_en signal and the scan-enable signal, and measuring the predetermined time period from said leading edge of the clock signal.

4. The method according to claim 1, wherein the circuit device comprises a decoded multiplexer.

5. The method according to claim 1,
wherein the electronic system further comprises:
a first flip-flop coupled to the first input terminal for storing the first test signal during the first mode, and for receiving the first response signal in the second mode, and
a second flip-flop coupled to the second input terminal for storing the second test signal during the first mode, and for receiving the second response signal in the second mode; and
wherein the predetermined time period has a duration at least; as long as a hold time of the first lip-flop and the second flip-flop.

6. The method according to claim 1,
wherein the electronic system further comprises:
a first scan flip-flop coupled to the first input terminal for storing the first test signal during the first mode, and
a second scan flip-flop coupled to the second input terminal for storing the second test signal during the first mode; and
wherein the predetermined time period has a sufficient duration to allow the first response signal and the second response signal to be captured by the first and second scan flip-flops during the second mode.

7. The method according to claim 1, wherein the predetermined time period is in the range of 0.4 to 2 nanoseconds.

8. The method according to claim 1,
wherein the electronic system includes a mutual exclusivity circuit for generating the control signal in response to a rst_tri_en signal, a scan-enable signal, a delay-enable signal and a clock signal that are transmitted in the electronic system, and
wherein the step of altering the control signal to the second logic level is performed when the rst_tri_en control signal transitions from a low logic level to a high logic level, and when the scan-enable signal transitions from a high logic level to a low logic level, and wherein the step of transitioning the control signal from the second logic level to the first logic level includes detecting a leading edge of the clock signal following the transitions of the rst_tri_en control signal and the scan-enable signal, wherein the predetermined time period is one cycle of the clock signal from said leading edge of the clock signal when the delay-enable signal is deasserted, and wherein the predetermined time period is at least two cycles of the clock signal from said leading edge of the clock signal when the delay-enable signal is asserted.

9. An electronic system including:

a gating circuit having a first input terminal, a second input terminal, a first output terminal, a second output terminal, and a control terminal for receiving a local control signal, wherein the gating circuit is selectively controllable to transmit predetermined mutually exclusive signals on the first and second output terminals when the local control signal has a first logic level, and selectively controllable to pass first and second signals from the first and second input terminals to the first and second output terminals when the local control signal has a second logic level;

a circuit device having a mutual exclusivity requirement coupled to first and second output terminals of the gating circuit; and a mutual exclusivity circuit for generating the local control signal transmitted to the gating circuit, wherein the mutual exclusivity circuit comprises:

a first flip-flop having an output lead, a data input lead and a scan-input lead, said data input lead of said first flip-flop being coupled to receive a first data value, said scan-input lead of said first flip-flop coupled to receive a scan-enable signal;

a second flip-flop having an output lead, a data input lead and a scan-input lead, said data input lead of said second flip-flop being coupled to said output lead of said first flip-flop, said scan-input lead of said second flip-flop coupled to receive the scan-enable signal;

a delay circuit having an input lead for receiving signals transmitted from said output lead of said second flip-flop; and a logic gate having a first input lead, a second input lead and an output lead, said first input lead being coupled to an output lead of said delay circuit, said second input lead being coupled to receive a global control signal, and said output lead of said logic gate being coupled to the gating circuit.

10. The system according to claim 9, further comprising;

a third flip-flop having an output lead, a data input lead and a scan-input lead, said data input lead of said third flip-flop being coupled to the output lead of said second flip-flop, said scan-input lead of said third flip-flop coupled to receive the scan-enable signal; and a multiplexer having a first input lead coupled to the output lead of the second flip-flop, and second input lead coupled to the output lead of the third flip-flop, a select lead coupled to receive a delay-enable signal, and an output lead coupled to the input lead of the delay circuit.

* * * * *

UNITED STATES PATENT AND TRADEMARK OFFICE
CERTIFICATE OF CORRECTION

PATENT NO.    : 6,081,913
DATED         : June 27, 2000
INVENTOR(S)   : Sridhar Narayanan and Marc E. Levitt It is certified that error appears in the above-identified patent and that said Letters Patent is hereby corrected as shown below:

Column 10,
Line 61, delete "and".
Line 67, delete "and".

Signed and Sealed this

Thirteenth Day of August, 2002

Attest:

Attesting Officer

JAMES E. ROGAN
Director of the United States Patent and Trademark Office